(12) United States Patent
Thimon et al.

(10) Patent No.: US 8,932,086 B2
(45) Date of Patent: Jan. 13, 2015

(54) BATTERY TERMINAL LUG EQUIPPED WITH SHUNT FOR MEASURING BATTERY CURRENT

(75) Inventors: Alain Thimon, Romainville (FR); Denis Gravat, Etaples (FR); Sébastien Perard, Le Touquet (FR); Nicolas Bogaert, Etaples (FR); Emmanuel Ryckebusch, Etaples (FR); Christophe Monteil, Paris (FR); Hugues Gervais, Noisiel (FR)

(73) Assignee: Valeo Equipements Electriques Moteur, Creteil (FR)

( * ) Notice: Subject to any disclaimer, the term of this patent is extended or adjusted under 35 U.S.C. 154(b) by 268 days.

(21) Appl. No.: 13/381,798

(22) PCT Filed: Jun. 28, 2010

(86) PCT No.: PCT/FR2010/051326
§ 371 (c)(1),
(2), (4) Date: Jul. 11, 2012

(87) PCT Pub. No.: WO2011/001085
PCT Pub. Date: Jan. 6, 2011

(65) Prior Publication Data
US 2012/0270452 A1    Oct. 25, 2012

(30) Foreign Application Priority Data
Jul. 2, 2009 (FR) ..................................... 09 54526

(51) Int. Cl.
H01R 4/42       (2006.01)
(52) U.S. Cl.
USPC ........................... 439/763; 439/762; 439/754

(58) Field of Classification Search
USPC .................................................. 439/762, 754
See application file for complete search history.

(56) References Cited

U.S. PATENT DOCUMENTS

| | | | |
|---|---|---|---|
| 6,551,147 B2 * | 4/2003 | Wakata et al. ................ | 439/754 |
| 7,381,101 B2 * | 6/2008 | Roset et al. .................. | 439/754 |
| 7,500,888 B2 * | 3/2009 | Roset et al. .................. | 439/754 |
| 7,578,710 B2 * | 8/2009 | Koelle et al. ................. | 439/762 |
| 8,142,237 B2 * | 3/2012 | Condamin et al. ........... | 439/762 |
| 8,305,034 B2 * | 11/2012 | Rubio .......................... | 320/105 |
| 2007/0194747 A1 * | 8/2007 | Alvarez-Troncoso et al. ............................ | 320/104 |

FOREIGN PATENT DOCUMENTS

| | | |
|---|---|---|
| DE | 10 2004 055 847 | 6/2006 |
| DE | 10 2007 018 669 | 10/2008 |
| DE | 20 2008 017 318 | 6/2009 |
| FR | 2 910 719 | 6/2008 |
| WO | WO 2008/151181 | 12/2008 |

* cited by examiner

Primary Examiner — Hien Vu
(74) Attorney, Agent, or Firm — Berenato & White, LLC

(57) ABSTRACT

A battery terminal lug (1) is disclosed, the lug being equipped with a shunt (7) for measuring the battery current and other battery characteristics. The lug includes a support (8), such as for a printed circuit, of at least one electronic component. The lug is made up of a first part (2), which is configured to be secured to a terminal of the battery, and a second part, which is configured to be secured to the cable of the battery (which is ordinarily directly associated with the terminal of the battery). The two parts (2, 3) of the terminal lug are electrically insulated from one another and are provided with projecting portions (28, 38) to bear the shunt (7), and a casing (5, 6) to accommodate the shunt (7) and the support (8), wherein electrical insulation (4, 17) is positioned so as to intervene between the two parts (2, 3) of the terminal lug (1).

20 Claims, 13 Drawing Sheets

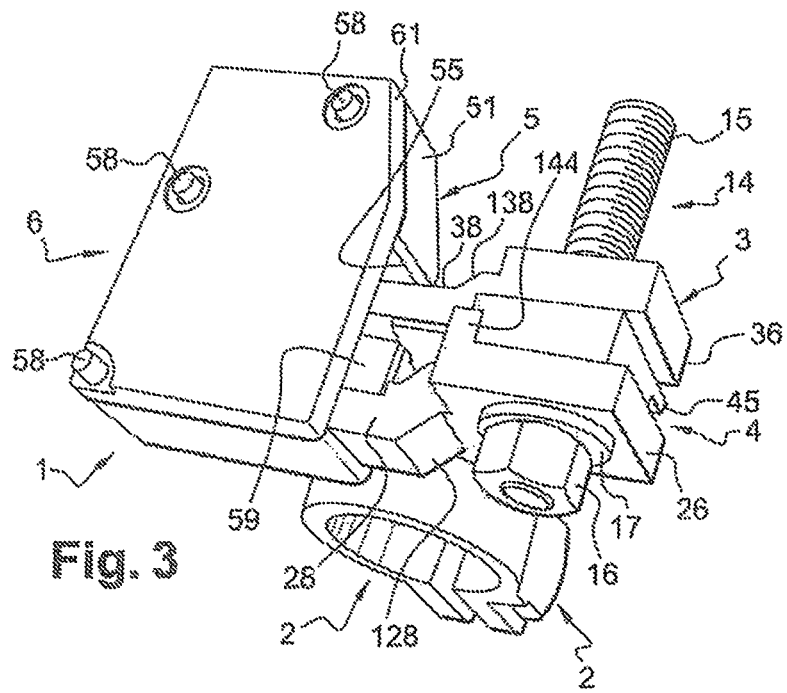
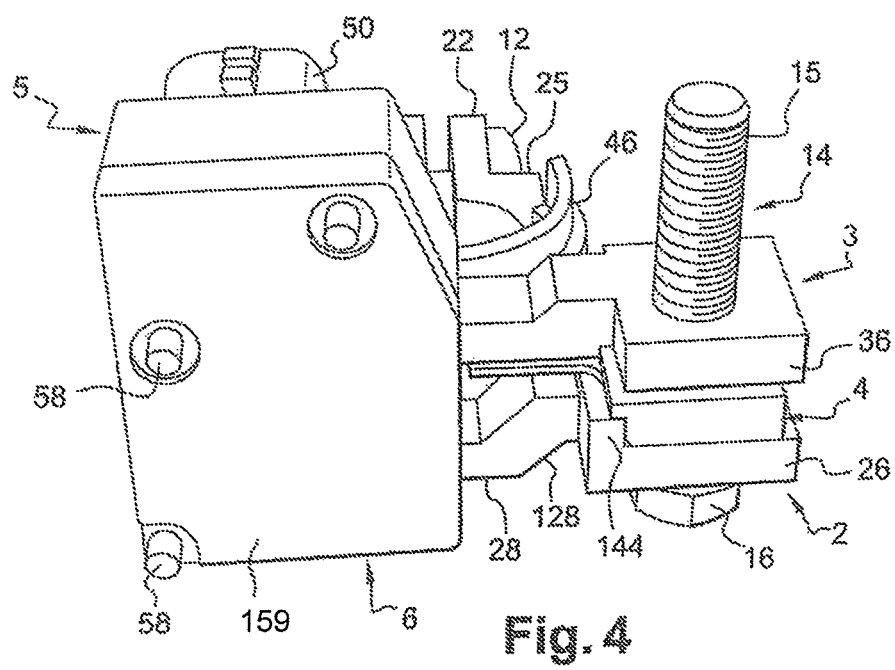

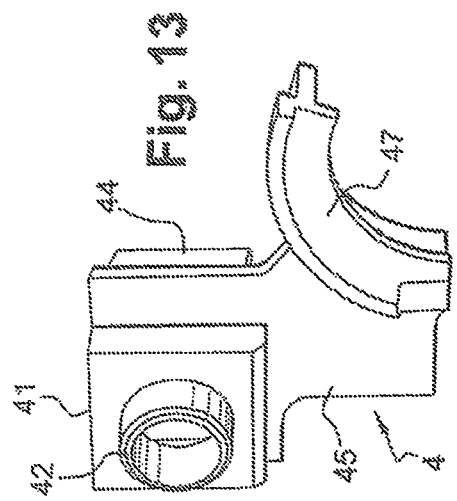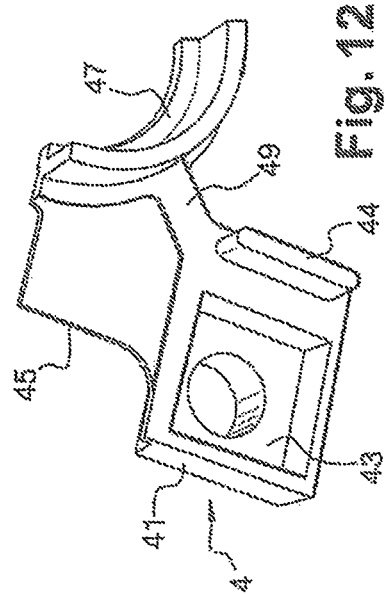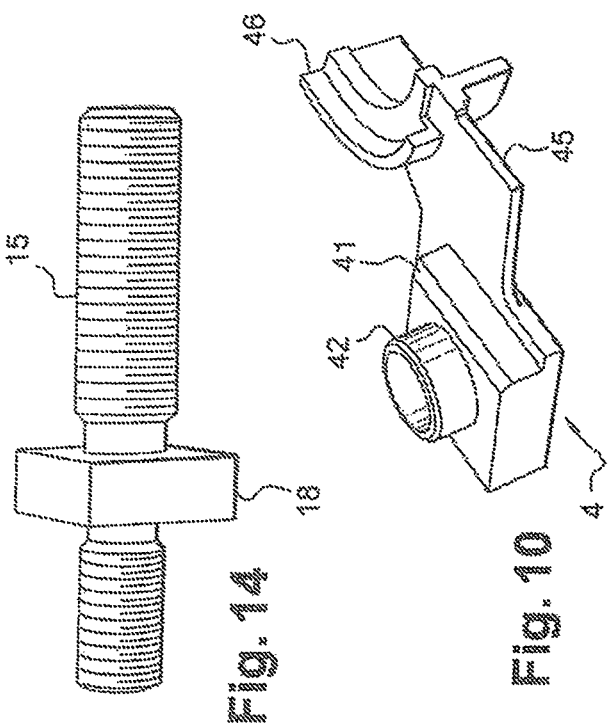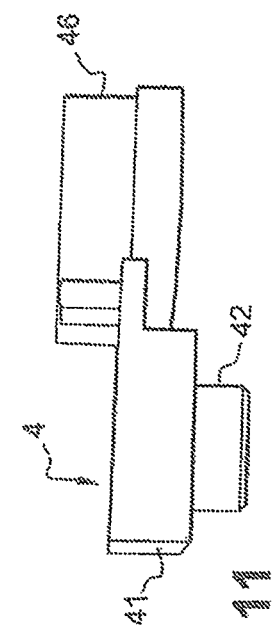

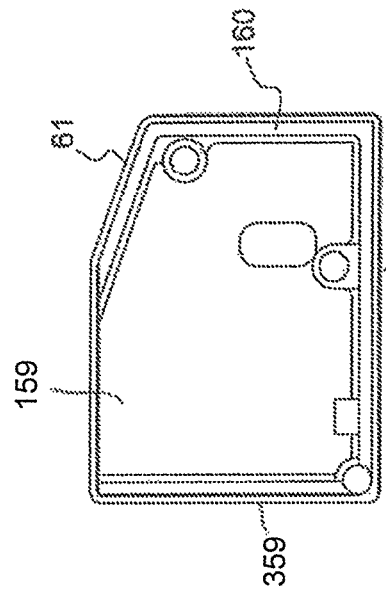
Fig. 15
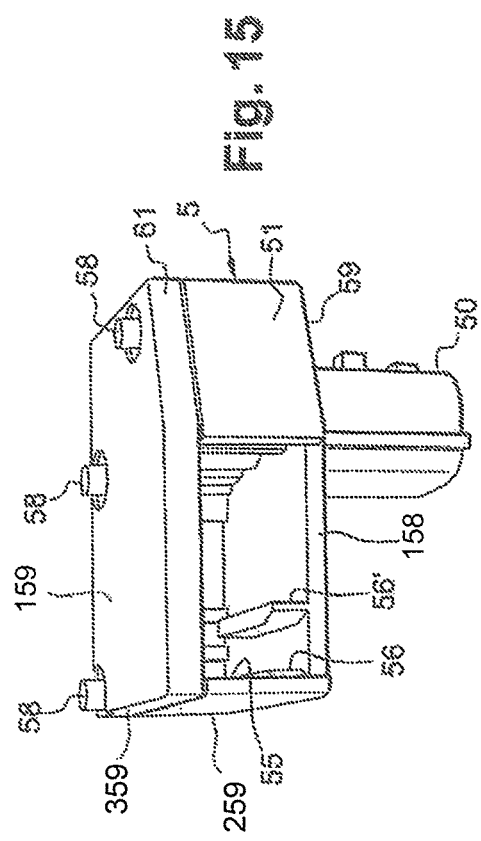
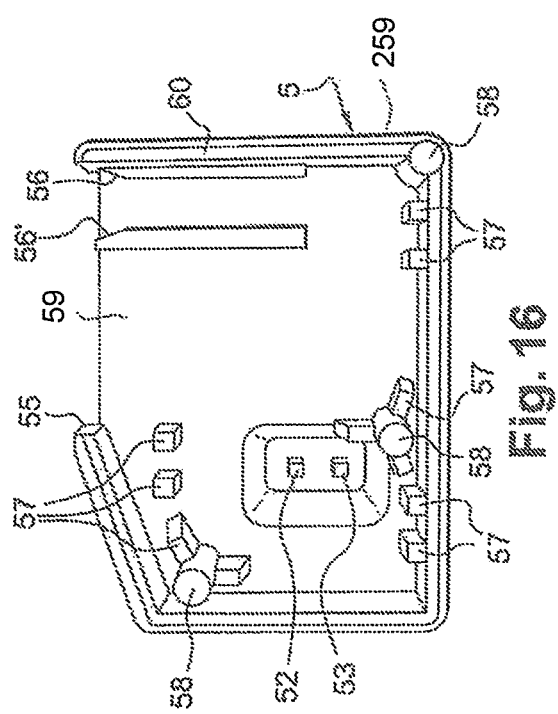
Fig. 17
Fig. 16

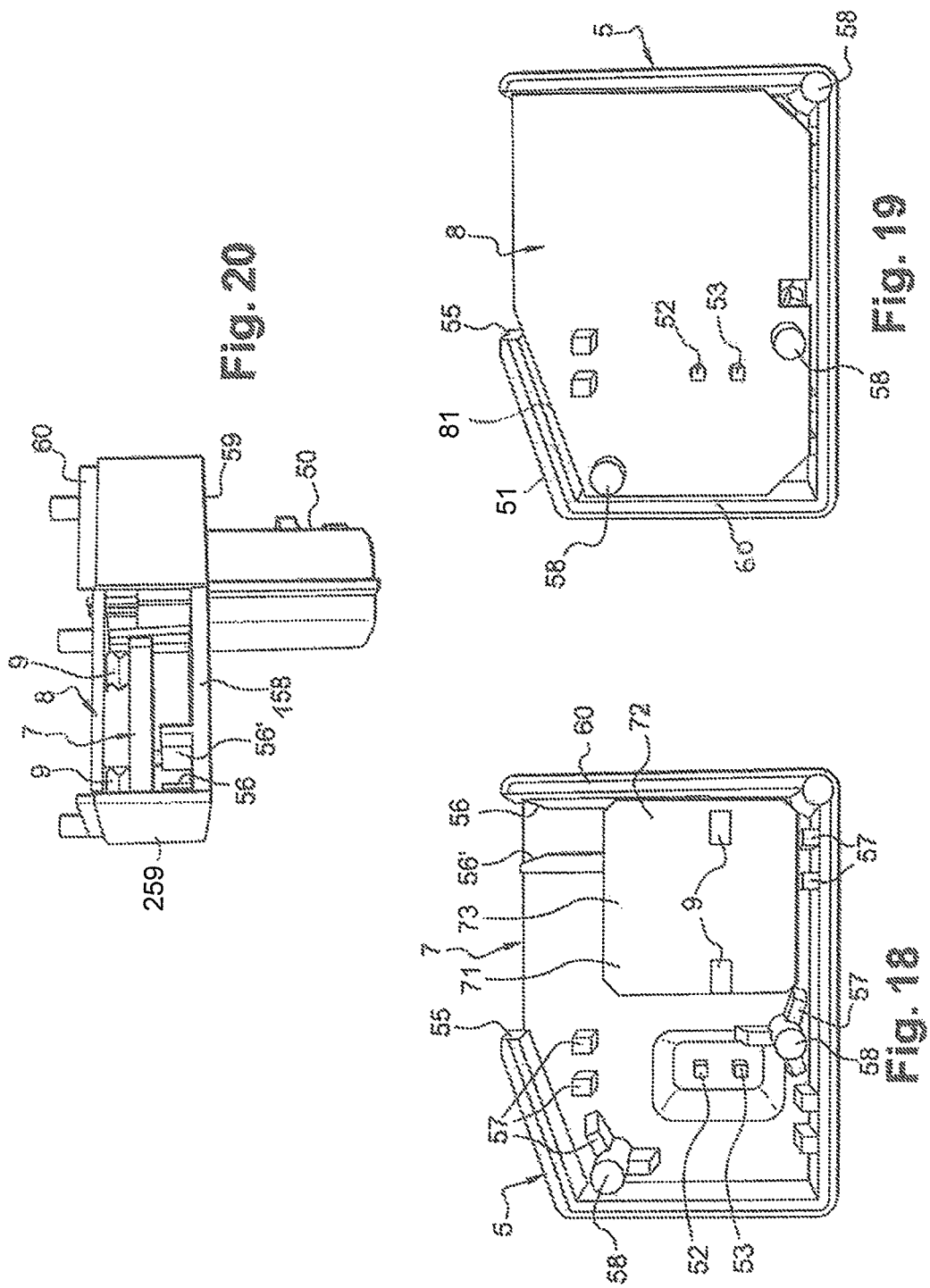

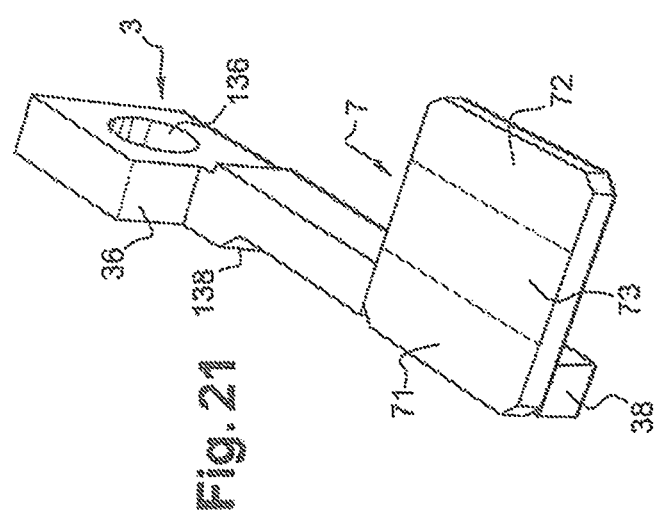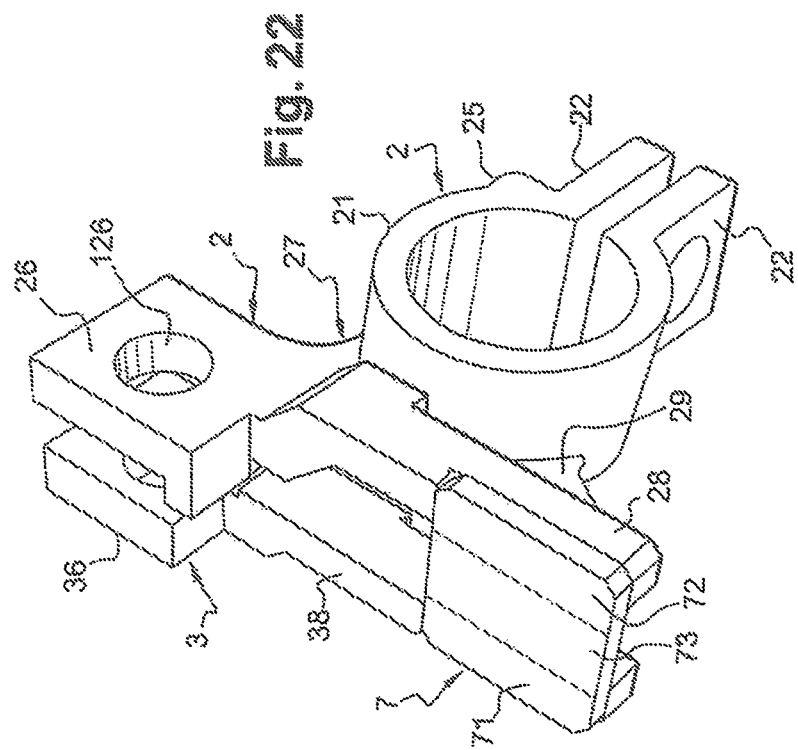

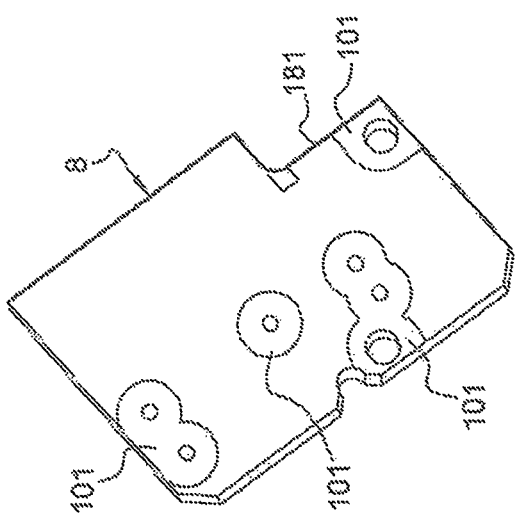
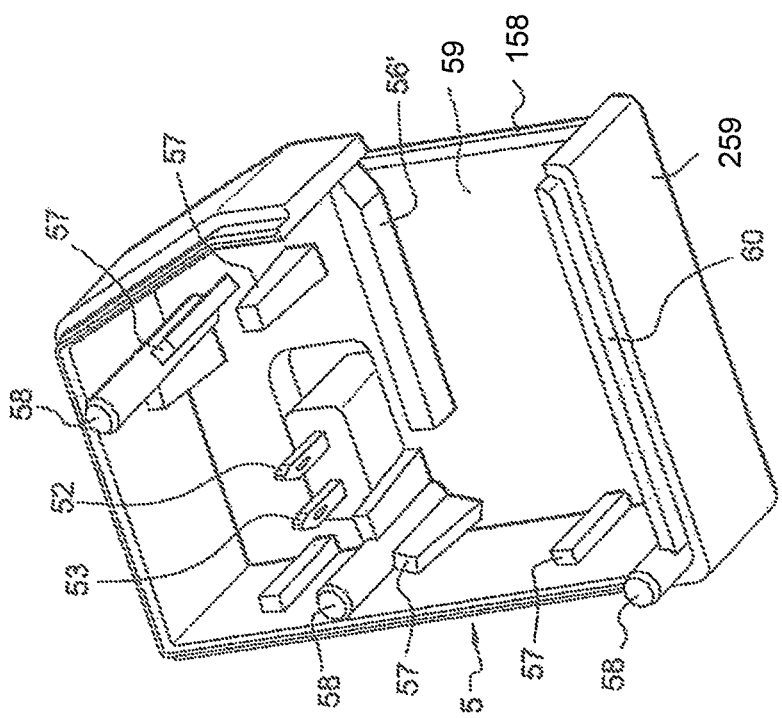

US 8,932,086 B2

BATTERY TERMINAL LUG EQUIPPED WITH SHUNT FOR MEASURING BATTERY CURRENT

CROSS-REFERENCE TO RELATED APPLICATIONS AND CLAIM TO PRIORITY

This application relates to International Application No. PCT/FR2010/051326 filed Jun. 28, 2010 and French Patent Application No. 09/54526 filed Jul. 2, 2009, of which the disclosures are incorporated herein by reference and to which priority is claimed.

FIELD OF THE INVENTION

The present invention relates to a battery terminal lug equipped with a shunt for measuring the battery current.

BACKGROUND OF THE INVENTION

A terminal lug of this type is described for example in document FR 2 866 158, the contents of which are incorporated herein by reference.

In this document the battery terminal lug, which is electrically conductive, and is configured to be fitted on a terminal of the battery, has a branch in which a bore is provided, in which there is fitted an electrically insulated sleeve for the passage of a connection rod which is connected to a battery cable, which for example is connected to the earth of the motor vehicle.

The free end of the rod bears a first tenon.

The terminal lug has a second tenon. A shunt for measuring the current of the battery has at each of its ends respectively a first bore and a second bore for forcing in respectively of the first tenon and the second tenon. The shunt is connected to a support which bears electronic components which are represented schematically in order to take into account the result of the measurement, optionally with analysis of the latter.

In addition to the battery current, the electronic components can measure other parameters of the battery, such as its temperature and voltage. These parameters can be analysed continually and used to follow the state of charging and the state of health of the battery.

In practice, the support is supported mechanically raised by the shunt by means of electrical connection means.

It may be desirable to protect the support and the shunt.

In this case use could be made of a solution described in document DE 10 2004 055 847, in Which the battery terminal lug, which is designed to be secured to a terminal of the battery, is in a single piece, and comprises an extension for support of a shunt which is fitted in the hollow space delimited by the shunt and the extension of the terminal lug. The shunt comprises firstly two electrically conductive parts for connection respectively to the extension of the terminal lug and to the cable concerned of the battery, and secondly an intermediate measuring part. The extension of the terminal lug is connected electrically to the connection part concerned of the shunt, for example by welding or brazing. The other connection part of the shunt is connected by being screwed to the electrical insulation at the extension of the terminal lug.

In document FR 2 910 719, the shunt is also secured by one of its connection parts which has electric contact to the extension of the terminal lug at one part, and is in electric contact via its other connection part with the cable concerned of the battery. Electrical insulation means intervene at the level of the cable, between the shunt and the extension of the terminal lug.

According to one embodiment, these electrical insulation means belong to a casing for accommodation of an electric circuit which uses the information of the shunt. The shunt is secured respectively to the connection part and to the cable by means of screws and nuts.

In these two documents the shunt has a long length.

SUMMARY OF THE INVENTION

The object of the invention is to fulfil the requirement to protect the support and the shunt, whilst having a shunt with a reduced length.

According to the invention, a terminal lug of the aforementioned type comprising a first part which is configured to be secured to a terminal of the battery is characterised in that it comprises a second part which is configured to be connected to the cable of the battery which is associated with the terminal of the battery, in that the two parts are distinct from one another and are provided with projecting portions which are configured to bear the shunt and a casing to accommodate the shunt and the support, and in that electrical insulation means intervene between the two parts of the terminal lug.

By means of the invention the shunt and the support are protected, since they are accommodated in a casing. In addition, the shunt has a length which is shorter and is less stressed mechanically, since the second part of the terminal lug is designed to be connected to the cable concerned of the battery, whereas the first part of the terminal lug is designed to be connected to the terminal of the battery.

According to other characteristics taken in isolation or in combination:

- the casing with a hollow form comprises a housing which is closed by a cover;
- according to one embodiment the housing is deeper than the cover;
- according to another embodiment the cover is deeper than the housing;
- the housing or the cover comprise means for positioning the support mechanically;
- the means for positioning the support comprise splayed small columns which belong to the housing and each pass through an opening in the support;
- the body of the housing or the body of the cover belong to the means for positioning the support by co-operation of forms;
- the housing or the cover comprise mechanical support means for the support;
- the mechanical support means are constituted by vertical projections obtained from the base of the housing of the cover for contact with the lower surface of the support;
- the casing is configured to immobilise the support;
- the cover of the casing is configured to be supported on the upper surface of the support;
- the projecting portions of the two parts of the terminal lug are implanted globally one above the other;
- the casing has a lateral opening in which the projecting portions of the two parts of the terminal lug penetrate;
- the casing is filled with resin for securing of the housing to the projecting portions of the two parts of the terminal lug and for protection of the components which are fitted in the casing; and
- the projecting portions consist of support arms of the shunt.

Other advantages will become apparent in the light of the following description provided by way of non-limiting example and with reference to the attached drawings.

BRIEF DESCRIPTION OF THE DRAWINGS

FIGS. 1 to 4 are perspective views from different angles of the terminal lug according to the invention, comprising a first part which is designed to be secured to a terminal of the vehicle battery and a second part which is designed to be secured to the battery cable which is associated with this battery terminal;

FIGS. 10 to 13 are perspective views from different angles of the electrically insulating brace which is interposed between the two electrically conductive parts of the terminal lug in FIGS. 1 to 4;

FIG. 14 is a view of the bolt belonging to the means for securing the cable concerned of the battery, onto the terminal lug in FIGS. 1 to 4;

FIG. 15 is a perspective view of the insulated housing cover assembly belonging to the terminal lug in FIGS. 1 to 4;

FIG. 16 is a view from above of the housing in FIG. 15;

FIG. 17 is a view from below of the cover in FIG. 15;

FIG. 18 is a view similar to FIG. 16 showing the housing equipped with the current measuring shunt which the terminal lug in FIGS. 1 to 4 comprises, the other parts being removed;

FIG. 19 is a view similar to FIG. 18 showing the housing equipped with its support;

FIG. 20 is a view similar to FIG. 15 in which the housing is represented alone, and is equipped with the shunt and the support in FIGS. 18 and 19;

FIG. 21 is a perspective view of the second part of the terminal tug equipped with the shunt belonging to the terminal lug;

FIG. 22 is a perspective view of the two parts of the terminal lug equipped with the shunt in FIG. 21;

FIG. 26 is a perspective view of the housing of the terminal lug for another embodiment;

FIG. 27 is a perspective view from below of the support of the terminal lug for another embodiment;

DETAILED DESCRIPTION OF THE PREFERRED EMBODIMENTS

Figure 1:
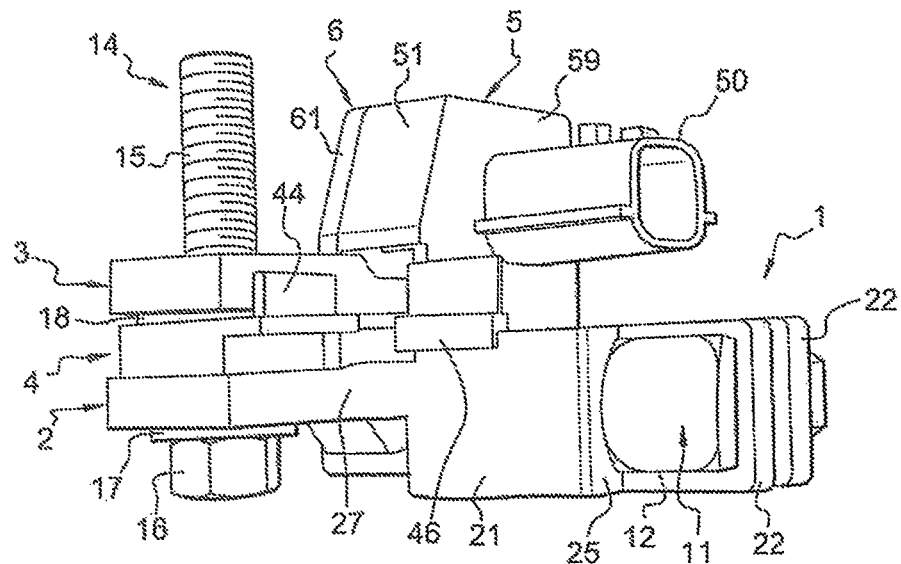

FIGS. 1 to 4 show at 1 the battery according to the invention.

A terminal lug 1 is equipped with a shunt for measuring the battery current, marked with the reference 7 in FIGS. 18, 20 to 22 and 25.

This electrically conductive terminal lug is modified relative to that of document FR 2 866 158, in particular in that the length of the shunt is reduced. Thus, according to one characteristic, the terminal lug 1 includes first and second parts 2, 3, respectively, which are distinct from one another, and are produced with projecting portions respectively 28, 38, which are configured to bear the shunt 7 and a casing 5, 6 to accommodate the shunt 7 and a support 8 which is associated with the shunt 7, in the manner described hereinafter.

A first part 2 of these parts is configured to be secured to one of the battery terminals of the motor vehicle.

The second part 3 is configured to be connected electrically to the battery cable which is associated with the terminal concerned of the battery.

For this purpose, the first part 2 bears means for securing to the battery cable. Economically, in this embodiment, these means for securing the cable belong to assembly means 14 which intervene between the two parts 2, 3. These assembly means 14 are integral with the first part 2, and pass through the second part 3. These means 14 comprise a bolt 15 (FIG. 14) provided with a part 18 for clamping and blocking in rotation, which is disposed between two threaded parts. In this embodiment the part 18 has a square cross-section.

According to one characteristic the parts 2, 3 are each provided with an assembly lug 26, 36, which in this case has a perforated rectangular form for passage of the threaded part concerned of the bolt 15. The lugs 26, 36 can be seen in FIGS. 5 to 9; the holes, which in this case are cylindrical, have respectively the references 126, 136.

The holes 126, 136 and the lugs 26, 36 are implanted opposite one another, the lug 36 being implanted above the lug 26 in the manner described hereinafter.

Each of these parts 2, 3 is configured in the manner described hereinafter, to be secured to the shunt 7 and thus to bear the shunt 7.

According to one characteristic, electrical insulation means 4, 17 intervene between the two distinct parts 2, 3.

In this case these means comprise a brace 4 made of electrically insulating material and an electrically insulating washer 17 which is described hereinafter. These means 4, 17 have additional functions in relation to the insulating sleeve according to document FR 2 866 158, in the manner described hereinafter.

The brace 4 is interposed between the two parts 2, 3, in particular in order to insulate the bolt 15, which in this case is made of metal and is electrically conductive, relative to the lug 26.

The two parts 2, 3 are electrically and thermally conductive, and have a mechanical function, since they are also configured to be secured mechanically respectively to the terminal and to the cable concerned of the battery. The two parts 2, 3 of the terminal are made of metal, and in this case each have low electrical resistance.

According to one embodiment the two parts 2, 3 are made of different materials.

According to another embodiment, the two parts 2, 3 are made of identical materials. These two parts 2, 3 of the terminal lug 1 are for example based on brass for economic reasons. According to one embodiment these parts are tin-coated. As a variant they are made of copper.

In this case these two parts are made of material which can be moulded in order to obtain the required forms. In the embodiment represented, the two parts 2, 3 are based on brass.

As a variant, at least one of the parts is machined. For example the second part 3, which has a simpler form than the first part 2, has a form which is obtained by machining.

The parts 2, 3 will be known respectively as the lower terminal lug and the upper terminal lug, since, as can be seen in FIG. 1, the second part 3 extends above the part 2.

In this case, the low terminal lug 2 is configured to be secured to the negative terminal of the battery, and the upper terminal lug 3 is configured to be connected to the battery cable, known as the earthing cable, which is connected to the earth of the motor vehicle. It will be appreciated that as a variant the lower terminal lug 2 is configured to be secured to the positive terminal of the battery, and the upper terminal lug 3 is secured to the positive cable of the battery.

In this embodiment 4 the brace is made of mouldable plastic material in order to obtain the required forms easily.

According to one embodiment this plastic material is reinforced by fibres.

The electrically insulating brace 4 can be seen better in FIGS. 10 to 13. This brace comprises a first part 41 which has a globally rectangular form, the size of which is adapted to that of the assembly lug 26 of the lower terminal lug 2.

This part 41 is provided with a cavity 43 (FIG. 12) which is perforated centrally. The hole is constituted by the central bore of a sleeve 42 which penetrates in the hole 126 in the lug 26 of the terminal lug 2.

As can be seen from the drawings, the shorter lower threaded part of the bolt 15 passes through the sleeve 42 and is electrically insulated relative to the terminal lug 2.

The part 18 is accommodated in the cavity 43, and is thus electrically insulated relative to the lug 26. The part 18 projects relative to the threaded parts of the bolt 15.

The brace 4, which is interposed between the lugs 26, 36, is therefore an electrical insulation brace which is interposed between the part 18 for clamping the bolt 15 and the tug 26.

The part 18 is higher than the part 41. This part 18 is therefore in electric contact with the lower surface of the lug 36 of the terminal lug 3. The longer threaded part of the bolt 15 passes through the hole 136 in the lug 36.

The brace 4 thus insulates the lug 26 electrically relative to the bolt 15, and thus relative to the lug 36 which is in electric contact with the part 18 of the bolt 15.

The assembly means 14 also comprise a washer 17, which in this case is electrically insulating, in contact with the lower surface of the lug 26, and a nut 16 which is screwed onto the end of the lower threaded part of the bolt 15, whilst being support on the insulating washer 17.

The electrical insulation means 4, 17 thus comprise the brace 4 and the washer 17, which according to one characteristic belong to the assembly means 14.

The bolt 15 is thus secured to the lug 26 by means of its clamping part 18 supported on the base of the cavity 43 which is in contact with the upper surface of the lug 26, and the nut 16 supported on the washer 17 which is in contact with the lower surface of the lug 26. The projecting part 18 thus forms a brace between the two assembly lugs 26, 36, with intervention of the base of the cavity 43 in order to insulate the assembly means 14 electrically relative to the lug 26.

The foregoing description shows that according to one embodiment, such as in document FR 2 910 719, the battery cable concerned, which in this case cannot be seen, has at its free end a washer or a perforated flattened part. This washer or this flattened part is in this case in electrical contact with the upper surface of the lug 36. The upper threaded part of the bolt 15 passes through this washer or this flattened part. A nut is screwed onto the end of the upper threaded part in order to clamp the washer or the flattened part of the cable. The lower surface of the lug 36 is in contact with the clamping part 18.

As a variant, the cable has at its free end a perforated metal bar, through which the upper threaded part of the bolt 15 can pass. According to one embodiment, the hole in the bar has a cylindrical form. As a variant it has an oblong form.

As a variant, the bar has a plurality of holes. As in the precedent embodiment, a nut is screwed onto the threaded upper part of the bolt 15 in order to clamp the end bar of the cable in contact with the lug 36, if applicable with the presence of a washer between the nut and the bar. In these embodiments, the bolt 15 thus belongs to the means for securing of the battery cable onto the upper terminal lug 3.

As can be seen in FIGS. 1 to 4 and 12, the lug 26 and the part 41 each have at the level of one of their edges a rib with an oblong form with the references respectively of 144 and 44. The ribs 44, 144 extend at 90° relative to one another. The rib 44 extends above the rib 144. This rib 44 is designed to co-operate with one of the edges of the lug 36 of the terminal lug 3. Thus, the brace 4 is blocked in rotation by the rib 144. The bolt 15 is blocked in rotation via its part 18 which is engaged in a complementary manner in the cavity 43. The terminal lug 3 is blocked in rotation by the rib 44.

It will be appreciated that as a variant the cross-section of the part 18 and of the cavity 43 has another form, for example hexagonal, or circular with at least one flattened part.

As a variant the ribs 44, 144 are divided up into parts.

As a variant the ribs 44, 144 are replaced by a east two pins.

In all cases means are provided for blocking in rotation by co-operation of forms between the brace 4 and the bolt 15 and between the brace 4 and the terminal lugs 2, 3.

The brace 4 therefore also has a function of blocking in rotation.

It is apparent from the foregoing description that, by means of the assembly lugs 26, 36, a first sub-assembly which can be manipulated and transported is produced, comprising the terminal lugs 2, 3, the brace 4 and the assembly means 14, before the shunt 7 is fitted.

According to another characteristic the terminal lugs 2, 3 are configured to bear a housing 5 with a hollow form which is closed by a cover 6, for formation of a casing with a hollow form.

For this purpose the terminal lugs 2, 3 each have a projecting portion 28, 38.

These projecting portions 28, 38 bear the shunt 7 at their free end, and extend generally in the same direction and next to each other, for example one above the other. Consequently, according to one characteristic, the shunt has a length which is reduced in comparison with the shunt according to the aforementioned documents FR 2 910 719 and DE 10 2004 055 847.

The shunt 7 is accommodated in the housing 5 which is closed by the cover 6, and is therefore protected. The cover 6 extends parallel to the base 59 of the housing 5, which in this case has a constant height.

In this example the housing 5 and the cover 6 are made of mouldable plastic material, in particular in order to obtain easily support projections in the manner described hereinafter.

According to one embodiment this plastic material is reinforced by fibres.

As can be seen for example in FIG. 20, the shunt 7, a support 8 for electronic components and electrical means 9 for connection between the support 8 and the shunt 7 are fitted in the housing 5 which is closed by the cover 6.

Thus, the terminal lug 1 has an additional function of protection of these components 7, 8, 9 in comparison with that of document FR 2 866 158.

It will be noted that the battery cable concerned does not penetrate into the housing 5.

According to one embodiment, the housing 5 and the cover 6 form a casing with a parallelepiped form and a rectangular cross-section.

In this case, the housing 5 and the cover 6, with a globally parallelepiped form, each have, as can be seen for example in FIGS. 1 to 4, 15, 16, 17 and 20, a base respectively 59, 159 and a vertical edge respectively 259, 359, which in this case extend perpendicularly relative to the base 59, 159, and are provided with a bevelled portion, respectively 51, 61, in order to create an undercut 51, 61 at the level of the securing means 14.

According to another embodiment the casing 5, 6 does no have undercuts 51, 61, and therefore has a parallelepiped form.

The vertical edges 259, 359 form a belt perpendicular to the base 59, 159, and belong to the bodies respectively of the housing 5 and the cover 6. The edge 259 is interrupted for formation of a lateral opening 55 described hereinafter.

In this embodiment the housing 5 is deeper than the cover 6, the edge 259 being higher than the edge 359.

According to another embodiment the cover 6 is deeper than the housing 5, the vertical edge of the cover having for example the height of the edge 259, whereas the vertical edge of the housing has a height equal to that of the edge 359.

Figure 25:
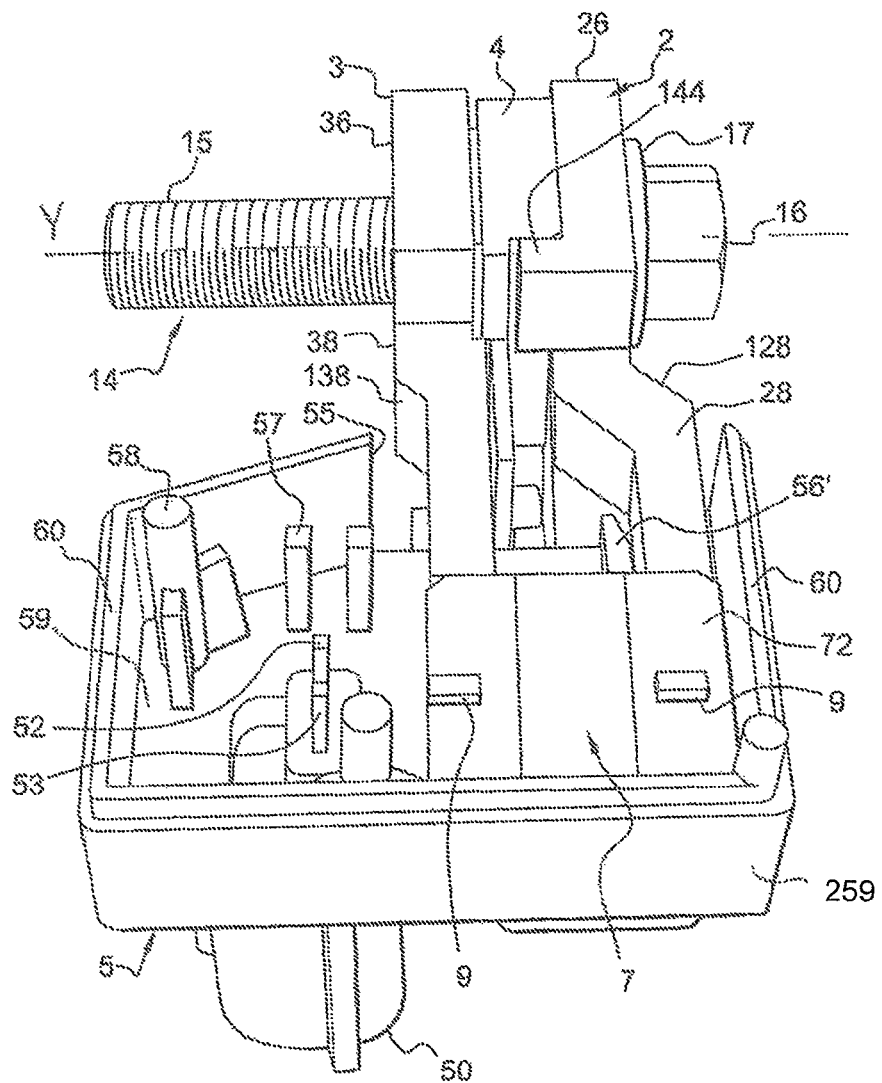
FIG. 25 is a view of the terminal lug without its cover and without its support.

The shunt 7 is electrically conductive. Its electrical resistance is by definition low. The shunt 7 is in the form of a plate, and, as can be seen in FIGS. 21, 22 and 25 comprises two parts 71, 72 for electrical connection respectively to the terminal lug 3 and to the terminal lug 2. These parts 71, 72 have good electrical conductivity. They are for example based on copper.

These parts 71, 72 are separated from one another by an intermediate part 73 made of a more noble material with great stability in terms of temperature. This part 73 is for example made of an alloy based on manganin or constantan.

For further details about the shunt, reference should be made to document EP 0 605 800.

In this case the shunt 7 has a constant thickness. As a variant, for economic reasons the thickness of the intermediate part 73 is smaller than the thickness of the connection parts. The shunt 7 has a rectangular form with rounded edges. In this embodiment the shunt has a globally square form.

The support 8 is in the form of an electrically insulating plate which bears electric tracks. Tracks of this type can be seen for instance in FIGS. 27 to 29 (see references 101). In this embodiment the support 8 is a printed circuit board indicated as PCB.

In this embodiment, according to one characteristic the support 8 is positioned mechanically by the housing 5, and supported mechanically on the housing 5 which is configured accordingly. According to one embodiment the support 8 is fastened on and immobilised in the manner described hereinafter by the cover 6 and the housing 5.

Thus, in this case, the support 8 has a globally rectangular form with an edge provided with an undercut in order to adapt on the interior to the form of the bevelled portions 61, 51 of the cover 6 and the housing 5.

In the embodiment in FIG. 19 the undercut 81 has a bevelled form in order to adapt to the inner periphery of the bevelled portion 51 of the edge 259 of the housing 5.

Figure 29:
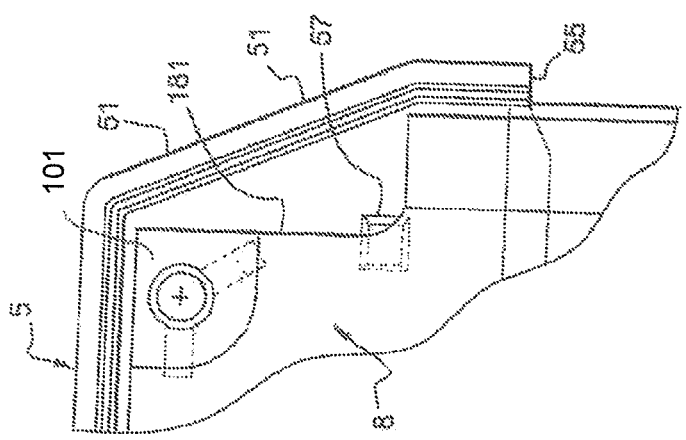
FIG. 29 is a partial view from above of the housing equipped with the support in FIG. 27.

As a variant, as can be seen in FIGS. 27 and 29, the undercut 181 of the support 8 is in the form of a square in order to save more material.

In this case this support 8 bears electronic components, and in particular an integrated circuit for processing of the signals, and at least one sensor connected to the integrated circuit.

The nature of the electronic components or of the sensors and the integrated circuit for processing of the signals depends on the applications. For the sake of greater clarity these components have not been represented, in the knowledge that they are supported by the upper surface of the support, as represented schematically in document FR 2 866 158.

Figure 28:
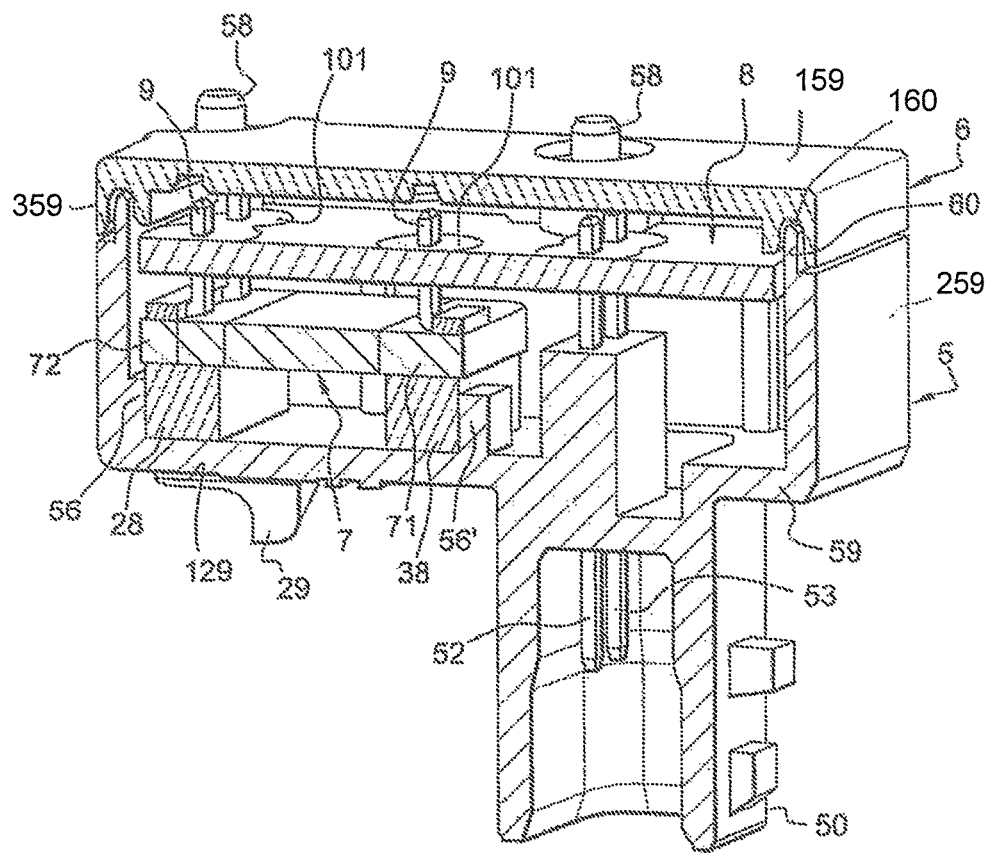
FIG. 28 is a view in cross-section of the terminal lug equipped with the housing and the support in FIGS. 26 and 27.

In this case the shunt 7 extends below the support 8, which has a longer length than the shunt (FIGS. 20 and 28).

The terminal lug 1 equipped with the support 8, which for example bears an integrated circuit, transmits information for example to a display unit, as described in document WO 96/33078, or to a computer such as the motor vehicle control computer, or to an alternator, or to an alternator-starter, or to a voltage regulator of the alternator, or to a starting system of the vehicle which is provided with a starter and/or an alternator starter to permit or prevent starting of the motor vehicle.

It will be remembered that an alternator-starter is a reversible alternator which also functions in electric motor mode, in order at least to start the motor vehicle.

All of this depends in the aforementioned manner on the applications.

The terminal lug 1 is configured to measure at least one parameter of the battery. In this embodiment the terminal lug is configured to measure at least the battery current via the shunt 7.

In this case a temperature sensor is also provided which transmits information to the integrated circuit. This temperature sensor comprises a probe which is placed opposite the intermediate part 73 of the shunt 7.

Electrical connection means 9, which can be seen for example in FIGS. 18, 20, 25, 28 and 30, intervene between the shunt 7 and electrical tracks of the support 8. The means 9 comprise at least two electrically conductive elements. A first one of these two elements intervenes between one of the connection parts 71, 72 of the shun 7 and a first electric track of the support 8. The other one of these two conductive elements intervenes between the other connection part 72, 71 of the shunt and a second electric track of the support 8. The first and the second track are connected to the integrated circuit. On this basis, in a known manner, it is possible to deduce the voltage between the two connection parts 71, 72 of the shunt 7, and therefore the battery current, which is proportional to the voltage between the two connection parts 71, 72 of the shunt 7.

In FIGS. 18, 20, 25, the elements of the means 9 consist of metal springs with an undulating form. These springs are for example welded respectively onto the part 71 and the part 72.

As a variant the springs are welded onto the electrical tracks of the support 8.

In the embodiment in FIG. 28, the elements are in the form of an "L" with a base which is welded onto the part 71, 72 concerned and a resiliently deformable head in the form of a point which is designed to establish electric contact by being secured in a metallised perforation in the support 8 belonging to a conductive track. This head, which has a curved oblong form, has an opening with an oblong form which is delimited by two curved contact branches. During the insertion into the perforation, the two branches are pre-stressed, and thus approach one another in order to establish electric contact with the edges of the perforation.

An assembly of this type is known as an assembly of the press-fit type.

This head can be splayed, as can be seen for example in FIG. 17 of document U.S. Pat. No. 3,634,819.

Advantageously, the head of the elements is not splayed, since the support is at least positioned mechanically by the housing of the casing, or is immobilised mechanically by the casing via its housing and its cover. The elements of the means 9 are thus simplified.

Figure 30:
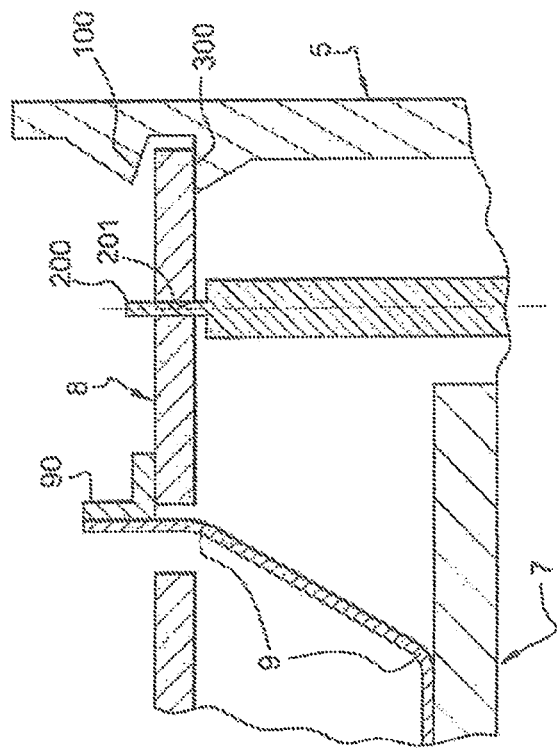
FIG. 30 is a partial view in cross-section showing another type of fitting of the support in the housing of the terminal lug, as well as another type of connection between the shunt and the support.

In FIG. 30 the means 9 consist of an electrically conductive flexible tongue which is welded onto the shunt and onto a part 90 which is welded onto the upper surface of the support 8. For this purpose the element 9 passes through an opening 91 in the support.

All these variants are made possible by the fact that, according to one characteristic, the support 8 is positioned or immobilised mechanically in the manner described hereinafter in the casing formed by the housing 5 and the cover 6. The means therefore do not have a mechanical function. They do not bear the support 8.

According to one embodiment the integrated circuit of the support 8 comprises an analogue/digital converter, an amplification circuit, and/or a microprocessor and/or a temperature compensation circuit, as described for example in documents EP 1 030 185 and EP 0 990 167.

According to document EP 0 990 167, two electrically conductive wires are provided, starting from the terminal lug. One of these wires is connected to the other terminal of the battery for electrical supply of the electronic components which the support 8 bears. The other one of the wires constitutes a wire for transmission of data, for example to a display unit or to a computer, such as the motor vehicle control computer, or to an alternator, or to an alternator-starter, or to a voltage regulator of the alternator or of the alternator-starter, or to the starting system of the vehicle.

According to one embodiment the terminal lug 1 is equipped with wires of this type which extend from the housing 5.

In the embodiment represented in the figures, the aforementioned electric wires do not extend from the housing 5, but are connected to a connector with pins which belong to the housing 5. The ends of these pins which pass through the support 8 have the references 52 and 53 in FIGS. 16, 18, 19, 25.

The pins project in the direction of the terminal lug, and are protected for this purpose by a projecting part 50 of the housing 5 which is moulded integrally with this housing. This projecting part 50 surrounds the pins for formation in this case of a connector of the male type. The part 50 is moulded integrally with the base 59 of the housing 5, and extends in the direction of the terminal lug 2.

A complementary connector, in this case of the female type, comprising the two ends of the aforementioned wires, is connected to this connector with pins of the housing.

It will be appreciated that as a variant it is possible to invert the structures, i.e. the connector of the housing being of the female type and the complementary connector being of the male type.

According to one characteristic, the terminal lug 1 is configured to support the casing 5, 6 and to permit easy assembly by insertion of the housing 5. This terminal lug 1 thus makes it possible to reduce the quantity of material of the casing 5, 6, and to facilitate the assembly of the housing.

Figure 5:
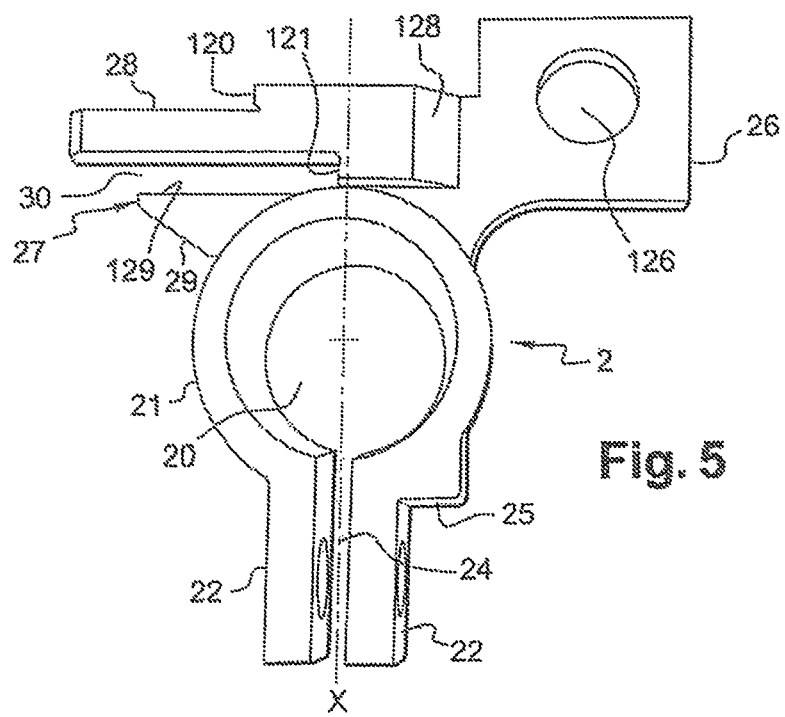
FIG. 5 is a view from below of the first part of the terminal lug in FIGS. 1 to 4.
Figure 6:
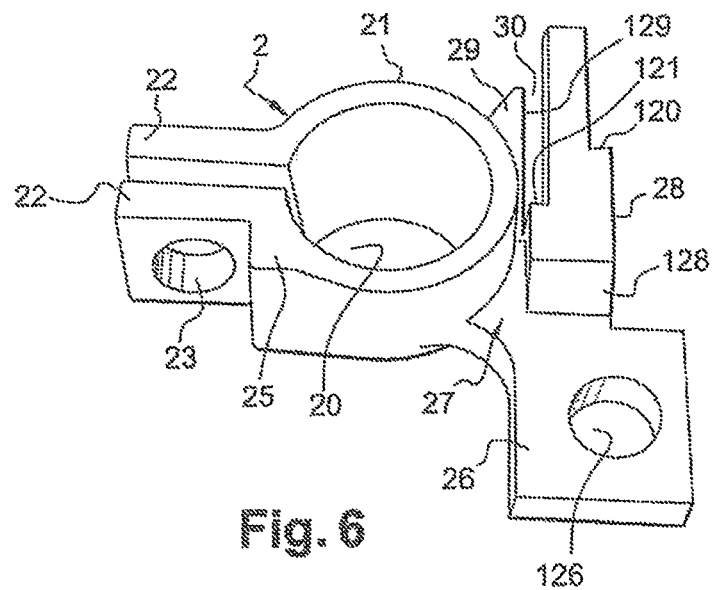
FIGS. 6 and 7 are perspective views from different angles of the first part of the terminal lug in FIGS. 1 to 4.
Figure 7:
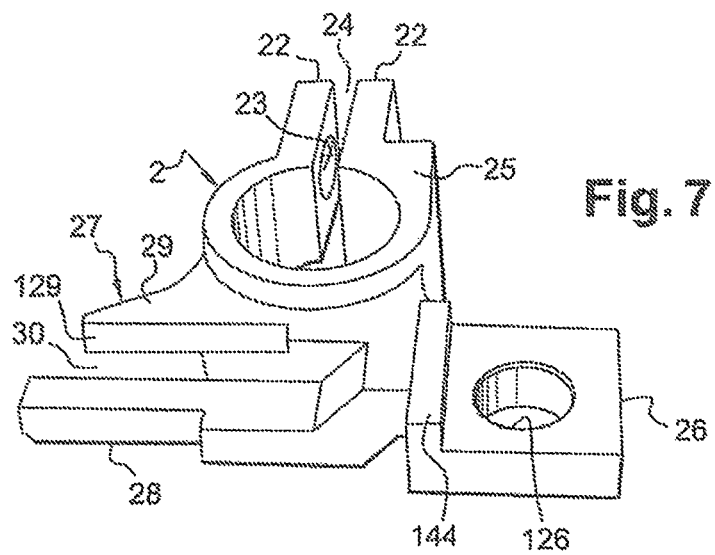
Figure 8:
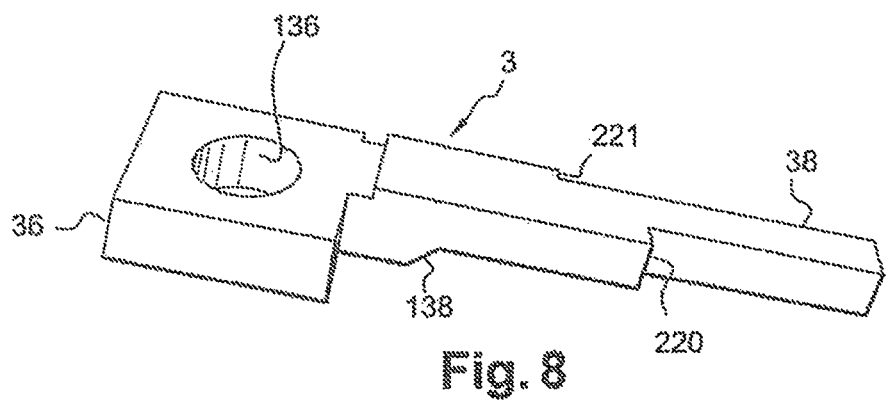
FIGS. 8 and 9 are perspective views from different angles of the second part of the terminal lug in FIGS. 1 to 4.
Figure 9:
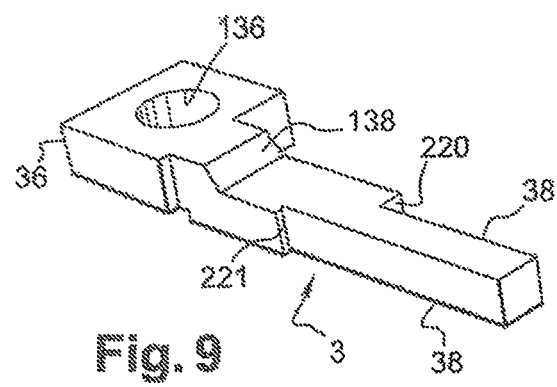

As can be seen for example in FIGS. 5 to 7, the lower terminal lug 2 comprises a clamping part which is provided with clamping lugs and an opening 20 in order to be fitted around the terminal concerned of the vehicle battery. As described in document FR 2 866 158, the opening 20 is delimited by an annular area 21 which is extended by the two projecting clamping lugs 22 opposite. In this case these lugs 22 are parallel to one another and have an orientation which is transverse relative to the area 21.

The centre of the opening 20 and of the area 21 constitutes the centre of the clamping part 21, 22.

The lugs 22 are each provided with a hole 23, and are separated from one another by a slot 24. A clamping grip is thus formed, and the clamping lugs 22 can be spaced from one another for fitting of the battery onto the terminal, which usually has a frusto-conical form, in area 21, by means of its opening 20. Clamping means 11 are then inserted in the corresponding holes 23, in order to draw the lugs 22 together and clamp the battery terminal which is fitted in the opening 20.

The clamping means 11, which in this case are made of metal, in this case (see FIGS. 1 and 2) consist of a bolt with a screw provided with a head. 12 which has a globally square form, and as a variant has a polygonal form. The head 12 of the screw is supported on the outer surface of one of the lugs 22, and is immobilised in rotation by co-operation of forms with an excess thickness 25 which the lower terminal lug 2 has at the level of the area of implantation of the lug 22 concerned in the annular area 21.

Figure 2:
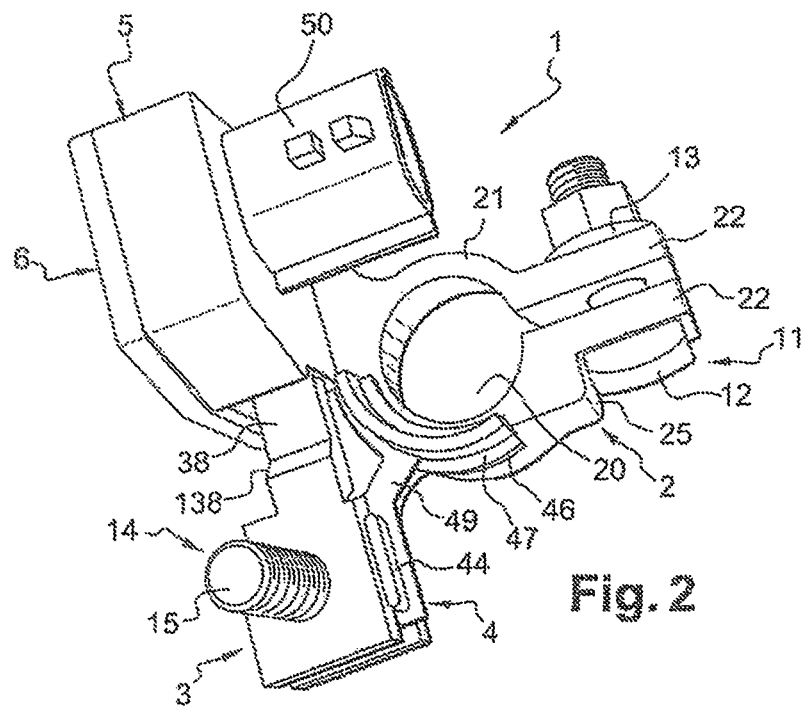
Figure 23:
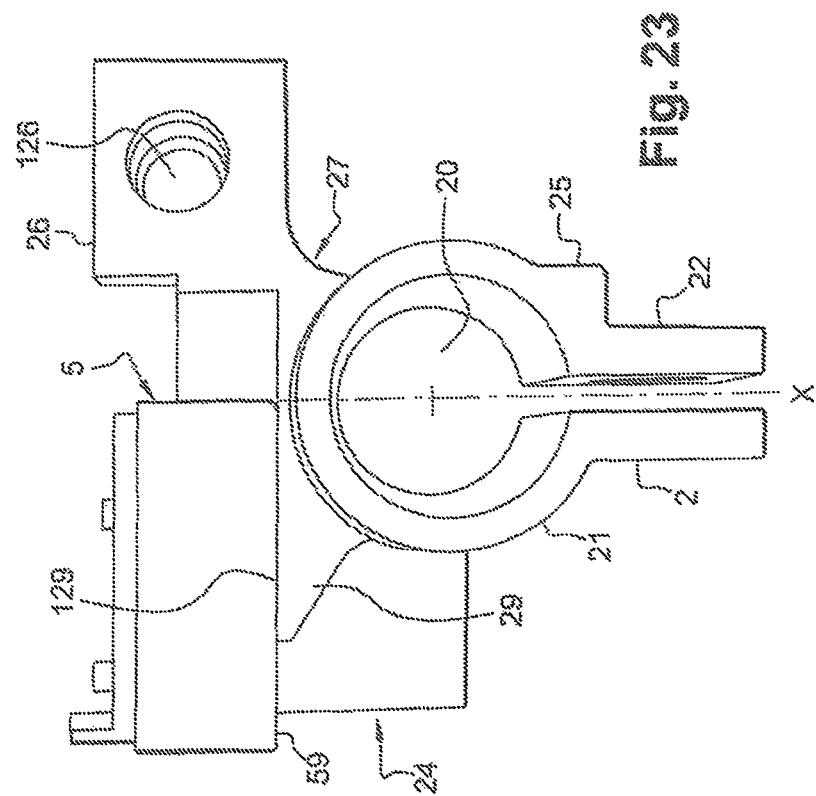
FIG. 23 is a view similar to FIG. 22 from another angle, with the housing put into place.
Figure 24:
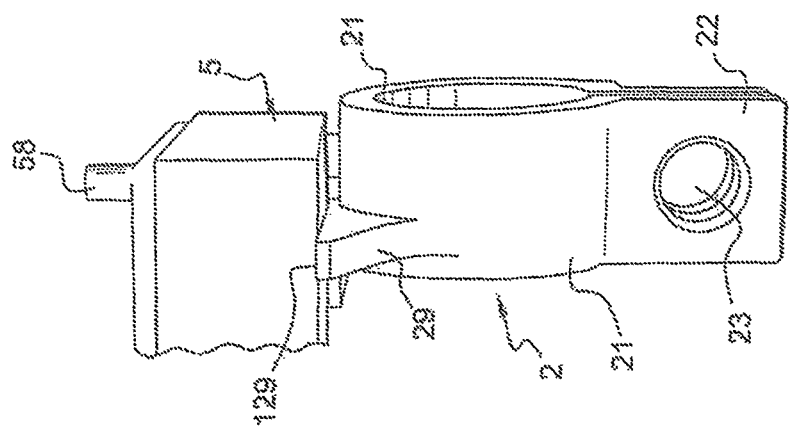
FIG. 24 is a partial view according to the arrow 24 in FIG. 23.

The threaded part of the screw passes through the holes 23. The nut of the bolt is supported on the outer surface of the other lug 22, in this case with interposition of a washer 13 (FIG. 2). When the nut is screwed, the lugs 22 are brought closer to one another in order to clamp the terminal lug 2 via its area 21 around the battery terminal. As can be seen for example in FIGS. 2, 4 and 23, the projecting part 50 of the housing 5 extends perpendicularly relative to the base 59 of the housing 5 and parallel to the branches 22, whilst being offset relative to the opening 20.

In this embodiment, the annular area 21, which is open at the level of the lugs 22, is globally in the form of a slotted clamping sleeve 21.

The lower terminal lug 2 also has, on the side diametrically opposite the lugs 22, and thus the slot 24 in the sleeve 21, a protuberance 27 which is connected to the sleeve 21. In this case the protuberance 27 is moulded integrally with the sleeve 21. It extends perpendicularly to the sleeve 21, and is thus integral with the sleeve 21. As a variant, the protuberance 27 is rendered integral with the sleeve 21 for example by welding.

This protuberance 27 extends on a plane which is perpendicular to that of the clamping lugs 22, between the outer periphery and the inner periphery of the sleeve 21. The aforementioned assembly lug 26 belongs to the protuberance 27, which in this case is in the form of a fin. In this case the lug 26 is integral with the protuberance 27. According to one characteristic, this protuberance 27 comprises a support 29 to retain the housing 5 in the manner described hereinafter. The support 29 has a pointed form. In this case it has a triangular form. The assembly lug 26 and the retention support 29 extend on both sides of the axis of symmetry X (FIGS. 5 and 23) of the lugs 22 which passes through the middle of the slot 24 and the centre of the opening 20. Thus, the lug 26 and the support 29 extend on both sides of the sleeve 21.

The assembly lug 26 is perforated centrally at 126 for passage in the aforementioned manner of the lower threaded part of the bolt 15.

A splayed arm 28 is connected to the lug 26 by an inclined portion 128 in the direction of the inner periphery of the sleeve 21, such that the arm 28 is offset relative to the support 29. The arm 28 projects relative to the lug 26, and faces in the direction of the support 29. This retention support 29 thus extends raised relative to the arm 28, and in the direction of the outer periphery of the sleeve 21. The projecting portion of the first part 2 is in this case thus constituted by the arm 28. In this case the lug 26 is integral with the arm 28, the inclined portion 128, and the protuberance 27.

The outer periphery 129 of the support 29 consists of a machined surface which extends perpendicularly to the axis X and parallel to the arm 28 which is also machined. The inner periphery of the arm 28 faces towards the surface 129.

A slot 30, which in this case has a constant width, thus exists between the outer periphery 129 of the support 29 and the inner periphery of the arm 28.

According to one characteristic of the invention, the casing 5, 6 comprises a lateral opening 55.

The lateral opening 55 is formed in at least one of the vertical edges 259, 359.

More particularly, in the embodiments in FIGS. 1 to 30, the housing 5 comprises laterally a blind opening 55 which is formed in its vertical edge 259 and is closed by the cover 6 (FIGS. 15, 16, 18 to 20 and 25) in order to form a rectangular opening 55, the large sides of which are constituted by the cover 6 and by the parallel edge 158 of the base 59 of the housing 5.

The projecting arm 28 which constitutes a projecting portion of the first part 2 is configured to penetrate in the opening 55 in the housing 5. The inner periphery of the arm 28 co-operates with the inner surface of the base 59. This inner periphery has a stepped thickness such that a shoulder 121 is formed (FIGS. 5 and 6) which is designed to be supported against the edge 58 of the base 59.

The length between the shoulder 121 and the free end of the arm depends on the depth of the housing 5, in order not to interfere with the latter.

The width of the slot 30 depends on the thickness of the base 59. It is globally equal to the thickness of the base 59. The edges of the slot 30 are offset, as can be seen in FIGS. 5 to 7.

In this case, to within the fitting play, this width 30 is equal to the thickness of the base 59. Thus, as can be seen better in FIGS. 23 and 24, the outer surface of the base 59 is in contact with the outer periphery 129 of the support 29, which thus according to one characteristic supports the housing 5.

The inner periphery of the arm 28 is designed to come into contact with the inner surface of the base 59.

According to one characteristic, the housing 5 is fitted simply by being inserted by means of its lateral opening 55 in the slot 30. This insertion movement is limited by abutment of the edge 158 against the shoulder 121.

The offsetting between the support 29 and the arm 28 permits stability of the assembly, and more specifically opposes movement of tilting of the housing 5.

The lateral edges of the arm 28, which globally have a rectangular cross-section, participate in the retention and stabilisation of the housing 5, and for this purpose have two parallel ribs 56, 56' (see for example FIGS. 15 and 16), between which the lateral surfaces of the end of the arm 28 engage.

The ribs 56 and 56' thus constitute guide rails for fitting of the housing by insertion in the slot 30. These ribs 56, 56' also strengthen the base 59 and the lateral edge of the housing 5 which is furthest from the portion 51, since the rib 56 is adjacent to this base.

The height of the ribs is preferably less than, or equal to, the height of the end of the arm 28, since the outer periphery of the arm 28 bears the shunt 7 which is secured by being welded onto the outer periphery of the arm 28.

The shunt 7 abuts the shoulder 120 which is offset relative to the shoulder 121 in the direction of the free end of the arm 28.

In this case, the shunt 7 is secured by being welded onto the free end of the arm 28.

More particularly, the connection part 72 of the shunt 7 is secured by being welded onto the outer periphery of the arm 28.

The welding of the shunt 7, supported on the outer periphery of the arm 28, is carried out by means of an electrode which is supported on the inner periphery of the arm 28. This is made possible by the fact that, according to one characteristic, the retention support 29 is offset relative to the arm 28, in order to permit the passage of the electrode for welding of the shunt 7 onto the arm 28.

The upper terminal lug 3 (FIGS. 3, 8, 9, 21) has a projecting arm 38 with a form similar to the arm 28. This arm 38 constitutes the projecting portion of the second part 3.

The arm 38, which has a globally rectangular cross-section, is connected to the aforementioned assembly lug 36 by an inclined portion 138, such that the arm is offset relative to the lug 36. The arm 38 is configured to penetrate in the lateral opening 55.

The arm 38 has a shoulder 221 at the level of its inner periphery in order to abut against the edge 58 of the opening 55. At the level of its outer periphery it has a shoulder 220 for the shunt.

The shunt 7 abuts the shoulder 220 which is offset relative to the shoulder 221 in the direction of the free end of the arm 38.

The welding of the shunt 7, supported via its connection part 71 on the outer periphery of the arm 38, is carried out by means of an electrode which is supported on the inner periphery of the arm 38.

The inner periphery of the arm is designed to come into contact with the inner surface of the base 59.

As will have been understood, the terminal lugs 2, 3 are equipped with the assembly means 14 and the brace 4, then with the shunt 7 by means of welding, before fitting this sub-assembly 2, 3, 14, 4, 7 which can be manipulated and transported, by insertion in the housing 5.

It will be appreciated that, as a variant, the parts 71, 72 of the shunt 7 are secured by brazing or gluing onto the free ends of the arms 38, 28.

It is apparent from the foregoing description that according to one characteristic, the casing 5, 6 has a lateral opening 55 into which there penetrate two projecting portions 28, 38 of the two parts 2, 3 of the terminal lug 1. More specifically, the two parts 2, 3 each have for this purpose a projecting arm 28, 38 to support the shunt 7, which penetrates into the housing 5.

The arms 28 and 38 globally have the same size, and their thickness is stepped as can be seen in FIG. 22, in which only the terminal lugs 2, 3 and the shunt 7 are shown for greater clarity.

The arms 28, 38 are parallel, as can be seen in FIGS. 22 and 25, and constitute the two projecting portions of the two parts 2, 3 implanted globally one above the other relative to the axis Y (FIG. 25) of the bolt 15 of the assembly means 14.

As can be seen in these FIGS. 22 and 25, the outer peripheries of the ends of the arms 28, 38 are on the same plane, such that the shunt 7 extends parallel to the axis Y of the bolt 15 of the assembly means 14.

The distance between the arms 28, 38 depends on the width of the intermediate part 73. This distance is at least equal to the width of the intermediate part.

The flexibility of this arrangement will be appreciated, since the arms 28, 38 extend cantilevered relative to the assembly lugs 26, 36, and spaced from the sleeve 21 and the protuberance 27.

All of this is advantageous, since it makes it possible to minimise vibrations from the sleeve 21 to the shunt 7. It also makes it possible to limit the mechanical stresses, in particular during the clamping of the lower terminal lug 2 on the battery terminal, since the clamping lugs 22 are spaced from the lugs 26, 36. In addition a slot 30 exists at the level of the arm 28.

It will be appreciated that the material of the casing 5, 6 is reduced because the free ends of the arms 28, 38 and the shunt penetrate into the casing 5, 6 by means of the opening 55. The casing is not over-moulded onto the sleeve 21, such that the solution is economical.

The casing 5, 6 is offset relative to the axis X.

The assembly means 14 and the casing 5, 6 extend globally on both sides of the plane X.

It will be appreciated that the shunt 7 has a short length, and is separate from the securing area respectively of the cable concerned of the battery and the terminal concerned of the battery. This shunt 7 is spaced from the assembly lugs 26, 36 and from the assembly means 14. It is therefore arranged mechanically. Thus, according to one embodiment the connection part 71 of the shunt 7 can be made of material which is different from that of the arm 38. Also, according to one embodiment, the connection part 72 of the shunt can be different from that of the arm 28. The shunt 7 extends globally parallel to the sleeve 21, and perpendicularly to the protuberance 27.

In FIG. 25 the brace 4 and the assembly means 14 are also shown.

This brace 4 (FIGS. 10 to 13) also has a fin 45 for connection of the part 41 to another part 46 in the form of an annular segment.

This segment is stepped and comprises a flat area 47 for connection between two skirts (without a reference) which are offset relative to one another. One of these skirts, which has a height lower than the other, is designed to come into contact with the outer periphery of the sleeve 21 (FIGS. 1 and 2).

The other skirt partly shields the arm 38. In case of vibrations, electrical insulation is thus provided between the two terminal lugs 2 and 3.

Ribs 49 reinforce the fin, extending on the outer periphery of the part 41 and above the rib 144.

The brace 4 thus has another, additional function.

It will be noted that the arms 28, 38 extend perpendicularly relative to the lugs 22. In this case the lugs 22 are parallel to one another. As a variant, the lugs 22 are corkscrewed as can be seen in document FR 2 866 158. In all cases the clamping sleeve 21 is slotted, and the protuberance 27 is globally diametrically opposite the slot in the sleeve 21; the lug 26 and the retention support 29 extend on both sides of the sleeve 21.

In the light of FIG. 2 in particular, the compactness of the terminal lug 1 will be appreciated, since the casing, comprising the housing 5 closed by the cover 6, is offset relative to the lugs 36, 26, whereas the bolt 11 extends parallel to the arms 38, 28, and the bolt 15 extends parallel to the casing 5, 6 and perpendicularly to the bolt 11.

According to one characteristic, the casing 5, 6 extends perpendicularly to the protuberance 27.

Naturally the size of the lateral opening 55 is dimensioned so that the arms 28, 38 equipped with the shunt 7 can penetrate in the housing 5.

The casing 5, 6 comprises a network of vertical projections 57 for support of the inner surface of the support 8 on the free ends of the projections 57. These projections constitute mechanical support means for the support 8. At least one of the vertical edges 259, 359 is used to position the support 8 mechanically by co-operation of forms.

More specifically, in FIGS. 16, 25, 26, the housing 5 comprises a network of vertical projections 57 for support of the inner surface of the support 8 on the free ends of the projections 57, obtained in this case by moulding of the base of the housing 5. The projections 57 constitute means for mechanical support of the support 8. These projections 57 are obtained from the base of the housing 5, and extend perpendicularly to the base.

The outer periphery of the housing 5 has a projecting rim 60 which belongs to the vertical edge 259, in order to penetrate in a groove 160 (FIGS. 17 and 28) provided in the vertical edge 359 of the cover 6. More specifically the rim 60 and the groove 160 belong respectively to the outer and inner periphery of the vertical edges 259, 359 of the housing 5 and of the cover 6. The rim 60 extends projecting vertically relative to the vertical edge 259 of the housing 5, with formation of a shoulder, which does not have a reference, and can be seen better in FIG. 26, for support if applicable of the inner surface of the vertical rim of the cover 6. Small columns 58, of which in this case there are three, are designed to position the cover mechanically relative to the housing 5, so that the rim 60 penetrates into the groove 160. The small columns 58 extend perpendicularly relative to the base of the housing, as can be seen in FIGS. 16, 18, 25, 26. These small columns pass through the cover 6, as can be seen for example in FIGS. 3 and 4.

Two of the small columns 58 (FIG. 19) are also used to position the support 8 mechanically relative to the cover 6. More specifically, these two small columns 58 are provided with projections 57 which are lower vertically than the small columns 58. The projections 57 constitute ribs for strengthening these two small columns 58 and mechanical supports for the support 8. The inner surface of the vertical edge of the housing, which belongs to the body of the housing, participates in the mechanical immobilisation of the support 8 by co-operation of forms. These two small columns 58 also pass through openings in the support 8 in the embodiment in FIG. 19. Just like the inner surface of the vertical edge 259 of the housing 5, they therefore belong to the means for positioning the support 8 mechanically.

The cover 6 is perforated for passage of the pins 52, 53.

As a variant, as can be seen in FIG. 28, the pins 52, 53 have a head similar to that of the heads of the elements 9 for the aforementioned, fitting of the press-fit type.

As is apparent from the description of the embodiment in FIGS. 1 to 25, the support 8, in the form of a printed circuit, is supported, via its inner surface on the tops of the support projections 57, and is in contact via its upper surface with the inner periphery of the edge 359 of the cover 6 which contains the groove 160.

According to one characteristic, in these embodiments, the support 8 is thus rendered mechanically integral by the casing 6, 5, such that the electrical connection means 9 do not have a mechanical function of support of the support 8 as in document FR 2 866 158.

The support 8 is therefore blocked in the casing 5, 6 and centred in it in particular by means of the small columns 58.

It will be appreciated that play exists between the base of the groove 160 and the end of the transverse rim 60 in order to make possible support of the cover 6 on the support 8 and to immobilise it. Also, slight play exists between the inner periphery of the rim 359 and the outer periphery of the rim 259.

This arrangement makes possible a large number of embodiments for the elements of the means 9.

It is also apparent from the description and the drawings that the support 8 is fitted after the housing 5 has been put into place on the terminal lugs 2, 3.

Taking into consideration FIG. 25, it can be seen that the support 8 is also fitted on the support projections 57, with the cover 6 being fitted finally.

According to one characteristic, finally, the casing 5, 6 is filled with electrically insulating protective resin.

According to one embodiment, with the cover 6 having been assembled with the housing 5, the casing 6, 5 equipped with the shunt 7 and the support 8 is filled with resin which has not yet been polymerised, via the opening 55.

As a variant the opening 55 is stopped up by means of a tool, and the housing 5 equipped with the shunt 7 and the support 8 is filled from the top with resin which has not yet been polymerised, then the cover 6 is secured on the housing 5.

All of this is made possible by the fact that clearances are present between the housing 5 and the support 8, as can be seen in FIG. 19. These clearances permit the passage of the resin.

These clearances are produced in particular by means of two chamfered corners of the support 8, by the presence of a blind opening in the support 8, and by the fact that the clearance 81 in the support 8 is spaced from the edge 51, as can be seen in FIG. 19. As a variant, in FIG. 25, the clearance 181 facilitates further the passage of the resin.

In this case the resin for protection of the components contained in the board has an additional function, since after polymerisation it secures the casing 5, 6 relative to the two terminal lugs 2, 3.

By means of the invention the housing 5 is thus retained by the terminal lugs 2, 3, whereas the support 8, in the form of an integrated circuit, is retained by the casing 5, 6, in other words centred and blocked by the housing 5 via the projections 57, the small columns 58 and the cover 6. The assembly is filled with resin in order to block mechanically the housing placed on the terminal lugs 2, 3, and to protect the components inside the housing 5, 6 against attacks by external agents.

It is understood that according to one embodiment the ends of the small columns 58 are flattened in hot conditions in order to form a connection by riveting between the cover and the housing.

As a variant the cover 56 is welded onto the housing 5. According to one embodiment the welding is ultrasound welding.

As a variant, as can be seen in FIGS. 27 and 28, the support 8, through which two of the small columns 58 pass, is supported on the projections 57, some of which constitute ribs for strengthening of the small columns 58, whereas slight play (FIG. 28) exists between the cover 6 and the upper surface of the support. This play is filled in by the resin. In all cases the support 8 is positioned mechanically at least by the small columns 58 and/or the vertical edge of the housing, and is supported mechanically at least on the projections 57. The elements of the means 9 therefore have a function only of electrical connection between the shunt 7 and the support 8, such that they are used economically. As a variant, the support 8 is also mechanically supported on a rim of the housing 5, which is also used to position the support 8 mechanically by co-operation of forms.

It will be appreciated that the protective and securing resin also makes it possible to filter the vibrations.

It is understood that the present invention is not limited to the embodiments described.

In particular, as a variant, the bolt 15 is secured by being welded to the lug 36 of the terminal lug 3.

As a variant, the threaded upper end of the bolt 15 is replaced by a frusto-conical terminal for securing of the battery cable concerned by means of a terminal lug with clamping tugs and a sleeve of the type according to the terminal lug 2.

As is apparent from the foregoing description, as a variant the assembly means 14 are distinct from the means for securing the cable to the upper terminal lug.

For example, as a variant, the bolt 15 is secured to the upper terminal lug 3 by means of a nut or by welding, whereas the cable is secured at its end for example directly by welding, or onto an additional terminal of the upper terminal lug 3.

As a variant, the additional thickness 25 of the terminal lug 2 is widened for securing of other electric wires of the electrical circuit of the vehicle.

As can be seen in FIG. 30, as a variant the housing 5 is provided with a horizontal rim 300 which faces towards the interior of the housing, with notches 100, such as Botches with a pointed form, and small columns 200 for centring of the support 8, each of which penetrates in a hole in the support 8.

The support 8 is fitted the housing 5 by being snapped in by means of the notches 100. Finally, the support 8 is supported on the rim 300, with the occurrence of play between the rim 300 and the inner surface of the notches. This play is filled in by the resin.

The cover 6 then no longer participates in the immobilisation of the support 8, which is trapped between the notches 100 and the rim 300.

In all cases the housing comprises means for support and mechanical positioning of the support 8.

According to one embodiment the support is secured and blocked by the casing 5, 6.

The elements of the electrical connection means 9 have two ends with a form which is identical to that of the heads of the elements in FIG. 28, for fitting of the press-fit type onto the shunt 7 and onto the support 8, and the shunt then has openings for this purpose.

As a variant, the means 9 comprise sheathed wires, the ends of which are welded onto the shunt 7 and onto an electrical track of the support 8. The wires pass through the support 8.

As a variant the rib 56' is offset (FIG. 27) in order to co-operate with the outer surface of the lateral edge of the arm 38, as can be seen in FIG. 28.

It is understood that the form of the retention support 29 can be modified. For example, the support 29 with the surface 129 can have a rounded edge.

As a variant it is possible to offset circumferentially the protuberance 27, which as a variant is therefore not diametrically opposite the slot in the sleeve 21. This depends on the applications, and more particularly on the environment at the level of the battery.

The clamping part 21, 22 of the terminal lug 2 can have another form, which depends on that of the terminal of the battery on which the clamping part 21, 22 is fitted.

It will be appreciated that it is possible to increase the thickness of at least one of the assembly lugs 26, 36 and/or at least one of the arms 28, 38, such that, according to another embodiment, the arm concerned 28, 38 is connected directly to these lugs 26, 36, with the inclined portion(s) 128, 138 being eliminated.

Thus, it is possible to increase the thickness of the lug 26 in order to eliminate the inclined portion 128. According to one variant it is possible to increase locally the thickness of the arm 38 as far as its shoulder 221 in order to eliminate the inclined portion 138.

Thus, according to one variant, at least one arm 28, 38 is connected to its assembly lug 26, 36 by an inclined portion 128, 138, such that the said arm 28, 38 is offset relative to its assembly lug 26, 36.

It is understood that it is possible to modify locally the cross-section of at least one of the arms 28, 38 at the level of its free end. For example, as a variant, the cross-section of the free end of one arm 28, 38 is a circular cross-section provided with two flattened parts, one for securing of the shunt, and the other for support of the welding electrode.

It is understood that when the shunt is secured on the arm by being glued, a single flattened part is sufficient, i.e. the one for support of the shunt 7.

In all cases the arms have on their outer periphery a splayed flat part for securing of the shunt, which extends peripherally relative to the protuberance 27.

As a variant only one 28, 38 of the arms has a shoulder 121, 131 on its inner periphery in order to co-operate by abutment with the edge 58 of the base 59 of the housing 5.

Similarly, as a variant, the means for blocking in rotation by co-operation of forms intervene between the brace 4 and only one of the assembly lugs 26, 36.

In the aforementioned manner it is possible to invert the structures, the cover 6 (FIG. 31) being deeper than the housing 5. For example, the height of the vertical edge 259' of the housing 5 with a groove 160' is equal to the height of the vertical edge 359 with a groove 160 in FIG. 28, whereas the height of the vertical edge 359' with a rim 60' of the cover 6 is equal to that of the edge 259 with a rim 60 of this FIG. 28.

Figure 31:
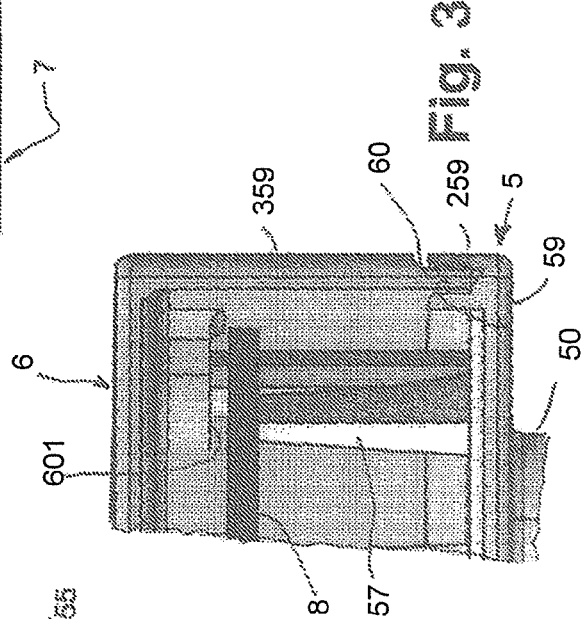
FIG. 31 is a partial view similar to FIG. 28 for yet another embodiment of the invention.

The base of the cover can have projections 601, one of which can be seen in FIG. 31, in order to co-operate directly, or indirectly, via the resin, with the upper surface of the support 8. In this embodiment the rim 60' is in contact with the base of the groove 160'.

In all cases assembly play is provided, since the cover with a groove 160 or a rim 60' and projections 601 cannot co-operate both with the edge 259, 259' of the housing with a rim 60 or a groove 160' and with the upper surface of the support 8. The play is slight, and is filled in by the resin in order to immobilise the support 8 well.

The inner surface of the vertical edge of the cover 6 can co-operate with co-operation of forms with the edge of the support, in order to position the support 8 mechanically. In this case, the vertical edge 359' of the cover 6 is notched for formation of the lateral opening 55, and the casing is filled with resin by means of the lateral opening 55.

According to one embodiment the casing has a parallelepiped form.

The invention claimed is:

1. A battery terminal lug (1) equipped with a shunt (7) for measuring a battery current and a support (8) of at least one electronic component, comprising:
    a first terminal lug part (2) configured to be secured to a terminal of a battery;
    a second terminal lug part (3) configured to be secured to a cable of the battery which is associated with the terminal of the battery;
    the first and second terminal lug parts (2, 3) being distinct from one another and are provided with elongated projecting portions (28, 38) to bear the shunt (7) and a casing (5, 6) configured to accommodate the shunt (7) and the support (8), and
    an electrical insulation (4, 17) intervening between the projecting portions (28, 38) of the first and second parts (2, 3) of the battery terminal lug (1);
    the casing (5, 6) having a lateral opening (55) in which the elongated projecting portions (28, 38) of the first and second parts (2, 3) of the terminal lug penetrate;
    the projecting portions (28, 38) of the first and second parts extending next to each other.

2. The battery terminal lug according to claim 1, wherein the casing (5, 6) is provided with means for positioning the support (8) mechanically, and with means for mechanical support for the support (8).

3. The battery terminal lug according to claim 1, wherein the projecting portions (28, 38) of the first and second parts extend generally in the same direction.

4. The battery terminal lug according to claim 3, wherein the casing (5, 6) is filled with resin for securing of the casing (5, 6) to the projecting portions (28, 38) of the first and second parts (2, 3) of the terminal lug (1) and for protection of the at least one electronic component fitted in the casing.

5. The battery terminal lug according to claim 4, wherein the first part (2) has a protuberance (27) with a first assembly lug (26) for assembly of the second part (3) to the first part (2), wherein the second part (3) has a second assembly lug (36) for assembly to the first assembly lug (26), wherein the projecting portion (28) of the first part (2) extends from the first assembly lug (26), and wherein the projecting portion (38) of the second part (3) extends from the second assembly lug (36).

6. The battery terminal lug according to claim 5, wherein the first assembly lug (26) and the second assembly lug (36) are perforated for the passage of assembly means (14) between the first and second assembly lugs (26, 36), and wherein the assembly means (14) comprises the electrical insulation (4, 17).

7. A battery terminal lug (1) equipped with a shunt (7) for measuring a battery current and a support (8) of at least one electronic component, comprising:
    a first terminal lug part (2) configured to be secured to a terminal of a battery;
    a second terminal lug part (3) configured to be secured to a cable of the battery which is associated with the terminal of the battery;
    the first and second terminal lug parts (2, 3) being distinct from one another and are provided with projecting portions (28, 38) to bear the shunt (7) and a casing (5, 6) to accommodate the shunt (7) and the support (8), and
    an electrical insulation (4, 17) intervening between the projecting portions (28, 38) of the first and second parts (2, 3) of the battery terminal lug (1);
    the casing (5, 6) having a lateral opening (55) into which the projecting portions (28, 38) of the first and second parts (2, 3) of the terminal lug penetrate;
    the projecting portions (28, 38) of the first and second parts extending generally next to each other;
    the casing (5, 6) filled with resin for securing of the casing (5, 6) to the projecting portions (28, 38) of the first and second parts (2, 3) of the terminal lug (1) and for protection of the at least one electronic component fitted in the casing;
    the first part (2) having a protuberance (27) with a first assembly lug (26) for assembly of the second part (3) to the first part (2);
    the second part (3) having a second assembly lug (36) for assembly to the first assembly lug (26);
    the projecting portion (28) of the first part (2) extending from the first assembly lug (26), and the projecting portion (38) of the second part (3) extending from the second assembly lug (36);

the first assembly lug (26) and the second assembly lug (36) perforated for the passage of assembly means (14) between the first and second assembly lugs (26, 36);

the assembly means (14) comprising the electrical insulation (4, 17);

the electrical insulation (4, 17) comprising an electrically insulating brace (4);

the assembly means (14) secured to the first assembly lug (26);

the assembly means (14) also comprising a bolt (15) passing through a hole (126) in the first assembly lug with interposition of the electrically insulating brace (4) in order to insulate the assembly means (14) relative to the first assembly lug (26).

8. The battery terminal lug according to claim 7, wherein the bolt (15) has two threaded parts which pass respectively through the hole (126) in the first assembly lug (26) and a hole (136) in the second assembly lug (36), wherein the bolt (15) comprises a clamping part (18) between the two threaded parts, wherein the clamping part (18) is interposed between the two assembly lugs (26, 36) and is fitted in a cavity (43) in the brace (4), wherein a height of the clamping part (18) is greater than a height of the brace (4), wherein a base of the cavity (43) is extended by a sleeve (42) which is engaged in the hole (126) in the first assembly lug, and wherein one of the threaded parts of the bolt (15) passes through the sleeve (42).

9. The battery terminal lug according to claim 8, further comprising means for blocking rotation between the brace (4) and at least one of the assembly lugs (26, 36).

10. A battery terminal lug (1) equipped with a shunt (7) for measuring a battery current and a support (8) of at least one electronic component, comprising:

a first terminal lug part (2) configured to be secured to a terminal of a battery;

a second terminal lug part (3) configured to be secured to a cable of the battery which is associated with the terminal of the battery;

the first and second terminal lug parts (2, 3) being distinct from one another and are provided with projecting portions (28, 38) to bear the shunt (7) and a casing (5, 6) to accommodate the shunt (7) and the support (8), and an electrical insulation (4, 17) intervening between the projecting portions (28, 38) of the first and second parts (2, 3) of the battery terminal lug (1);

the casing (5, 6) having a lateral opening (55) into which the projecting portions (28, 38) of the first and second parts (2, 3) of the terminal lug penetrate;

the projecting portions (28, 38) of the first and second parts extending generally next to each other;

the casing (5, 6) filled with resin for securing of the casing (5, 6) to the projecting portions (28, 38) of the first and second parts (2, 3) of the terminal lug (1) and for protection of the at least one electronic component fitted in the casing;

the first part (2) having a protuberance (27) with a first assembly lug (26) for assembly of the second part (3) to the first part (2);

the second part (3) having a second assembly lug (36) for assembly to the first assembly lug (26);

the projecting portion (28) of the first part (2) extending from the first assembly lug (26), and the projecting portion (38) of the second part (3) extending from the second assembly lug (36);

the first assembly lug (26) and the second assembly lug (36) perforated for the passage of assembly means (14) between the first and second assembly lugs (26, 36);

the assembly means (14) comprising the electrical insulation (4, 17);

the first part (2) of the terminal lug (1) having a sleeve (21); and the brace (4) having an annular sector with a protective skirt in contact with the sleeve (21) and a second protective skirt which partly shields the projecting portion (38) of the second part (3) of the terminal lug (1).

11. The battery terminal lug according to claim 10, wherein the projecting portions (28, 38) consist of arms (28, 38), wherein the arm (28) of the first part (2) extends from the first assembly lug (26), wherein the arm (38) of the second part (3) extends from the second assembly lug (36) and parallel to the arm (28) of the first assembly lug (26), and wherein the arms (28, 38) each have on an outer periphery thereof a splayed flat part for securing of the shunt (7), extending perpendicularly relative to the protuberance (27).

12. The battery terminal lug according to claim 11, wherein at least one of the arms (28, 38) is connected to the assembly lug (26, 36) thereof by an inclined portion (128, 138), such that the arm (28, 38) is offset relative to the assembly lug (26, 36) thereof.

13. The battery terminal lug according to claim 11, wherein the protuberance (27) comprises a retention support (29) which has on an outer periphery thereof a surface (129) parallel to the arm (28) of the first part (2).

14. The battery terminal lug according to claim 13, wherein the surface (129) of the retention support (29) and an inner periphery of the arm (28) which faces towards the surface (129) of the retention support (29) define a groove (30) for fitting by insertion of the casing (5, 6) by means of a lateral opening (55) in the casing (5, 6).

15. The battery terminal lug according to claim 14, wherein the first part (2) of the terminal lug (1) has a clamping sleeve (21), wherein the protuberance (27) extends perpendicularly to the sleeve (21), and wherein the retention support (29) and the first assembly lug (26) extend on both sides of the sleeve (21).

16. Terminal lug according to claim 14, wherein the casing (5, 6) comprises a housing (5) which is closed by a cover (6), wherein the housing (5) comprises a base (59) which delimits the lateral opening (55), and wherein a width of the groove (30) is generally equal to a thickness of the base (59) of the casing (5).

17. The battery terminal lug according to claim 16, wherein the base (59) of the casing (5) comprises two ribs (56, 56') which form two guide rails for the arms (28, 38) the shunt (7).

18. The battery terminal lug according to claim 3, wherein at least one of the projecting portions (28, 38) has on an inner periphery thereof a shoulder (121, 131) abutting an edge (58) of the base (59) of the casing (5).

19. The battery terminal lug according to claim 18, wherein the casing (5,6) comprises a housing (5) which is provided with projections (57) to support the support (8).

20. The battery terminal lug according to claim 19, wherein electrical connection means of the press-fit intervene between the shunt (7) and the support (8).

* * * * *